US006439897B1

(12) United States Patent
Ikeya (10) Patent No.: US 6,439,897 B1
(45) Date of Patent: Aug. 27, 2002

(54) SOCKET APPARATUS FOR REMOVABLY MOUNTING ELECTRONIC PACKAGES WITH IMPROVED CONTACTING SYSTEM

(75) Inventor: Kiyokazu Ikeya, Shizuoka (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/999,134

(22) Filed: Nov. 1, 2001

(30) Foreign Application Priority Data

Nov. 6, 2000 (JP) ........................................ 2000-336996

(51) Int. Cl.[7] .............................................. H01R 12/00
(52) U.S. Cl. .............................. 439/73; 439/66; 439/71
(58) Field of Search ............................. 459/71, 72, 73, 459/66

(56) References Cited

U.S. PATENT DOCUMENTS 6,033,235 A 3/2000 Ikeya 6,152,744 A * 11/2000 Maeda ........................ 439/71
6,174,174 B1 * 1/2001 Suzuki et al. ................. 439/71

* cited by examiner

Primary Examiner—Tho D. Ta
Assistant Examiner—Truc Nguyen
(74) Attorney, Agent, or Firm—Russell E. Baumann; Frederick J. Telecky, Jr.

(57) ABSTRACT

A socket (1) has a base (10) which forms a recess (10d) for receiving a support member (12). The support member (12) has a recessed surface (12a) for carrying a contact film (14) and has bores for mounting spring contact elements (15). The spring contact elements engage contact members (14b) of contact film (14) from below the film. An adapter (13) has a seat (13b) for a BGA package (2) for exposing solder balls (2a) to contact members (14b) from a location above the film. Socket terminal pins (11b) are electrically connected to spring contact elements (15) through circuit paths (13c) on a pitch expansion substrate (11). A cover (20) and a compression member (30) apply a force to the package.

10 Claims, 9 Drawing Sheets

SOCKET APPARATUS FOR REMOVABLY MOUNTING ELECTRONIC PACKAGES WITH IMPROVED CONTACTING SYSTEM

FIELD OF THE INVENTION

This invention relates generally to a socket for removably mounting an electronic part that has a large number of terminals on its lower surface in order to electrically connect each terminal to a circuit path which in turn is connected to test equipment for testing such electronic parts and more particularly to sockets of the type which employ a flexible contact sheet or film as a contact interface member.

BACKGROUND OF THE INVENTIONS

Figure 8:
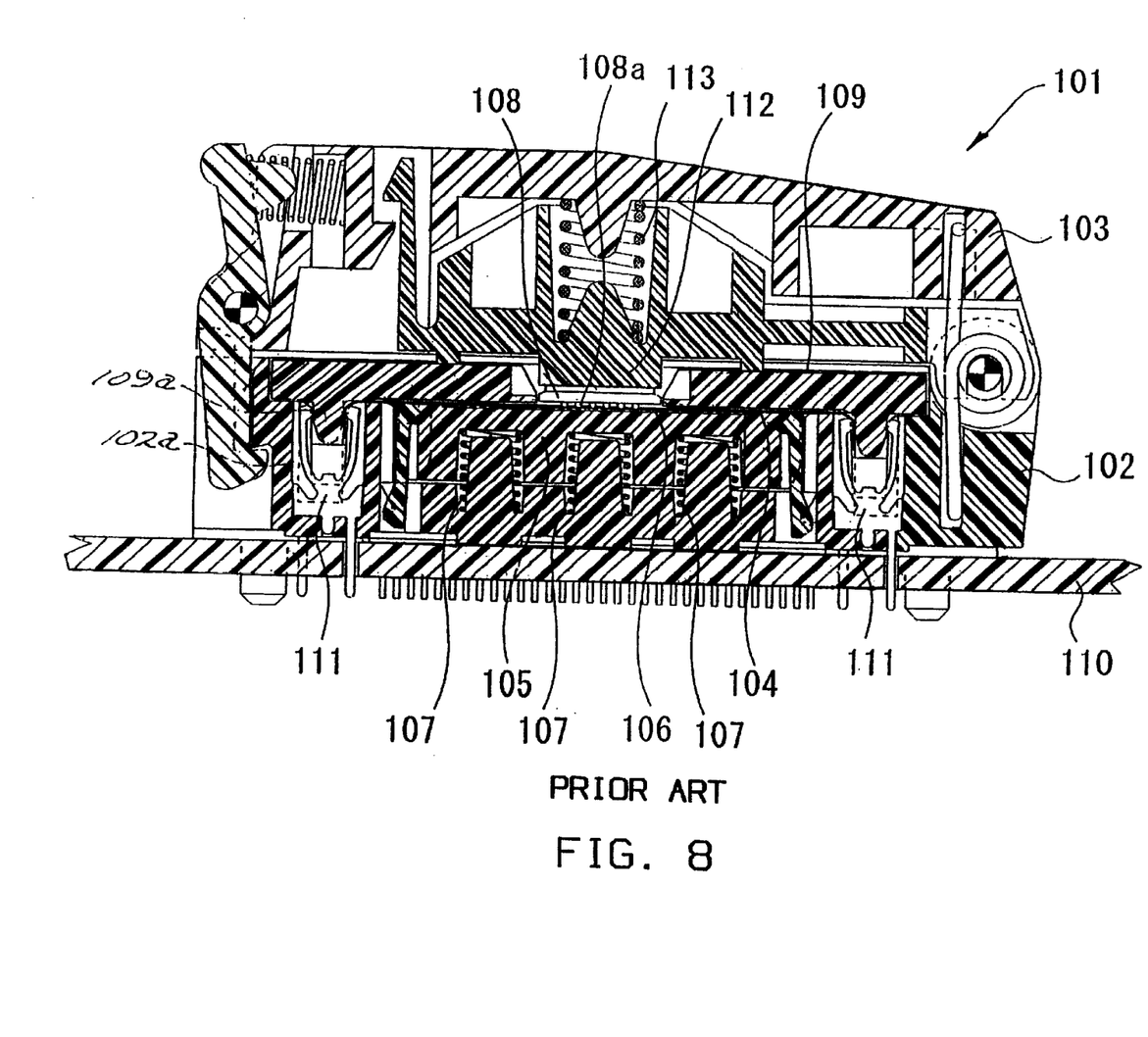
FIG. 8 is a side elevational cross section of a prior art socket.

It is conventional to subject semiconductor (IC) packages having resin sealed IC chips to various tests including a reliability test, called a burn-in test, to identify packages which do not meet required specifications. One such socket for use with semiconductor packages having terminals arranged in a Ball Grid Array (BGA) is shown in FIG. 8. As shown in the figure, socket 101 has a rectangular base 102 and a cover 103 pivotably mounted on the base and being movable between an opened position away from the base and a closed position engaged with the base. A contact film support 105, capable of supporting a contact film 104, to be described later, is provided at the central part of base 102. A thin flat rubber sheet 106 is disposed in a recessed portion formed on the upper surface of support 105. Compression coil springs 107 disposed between support 105 and base 102 provide an upwardly directed bias to support 105.

Figure 9:
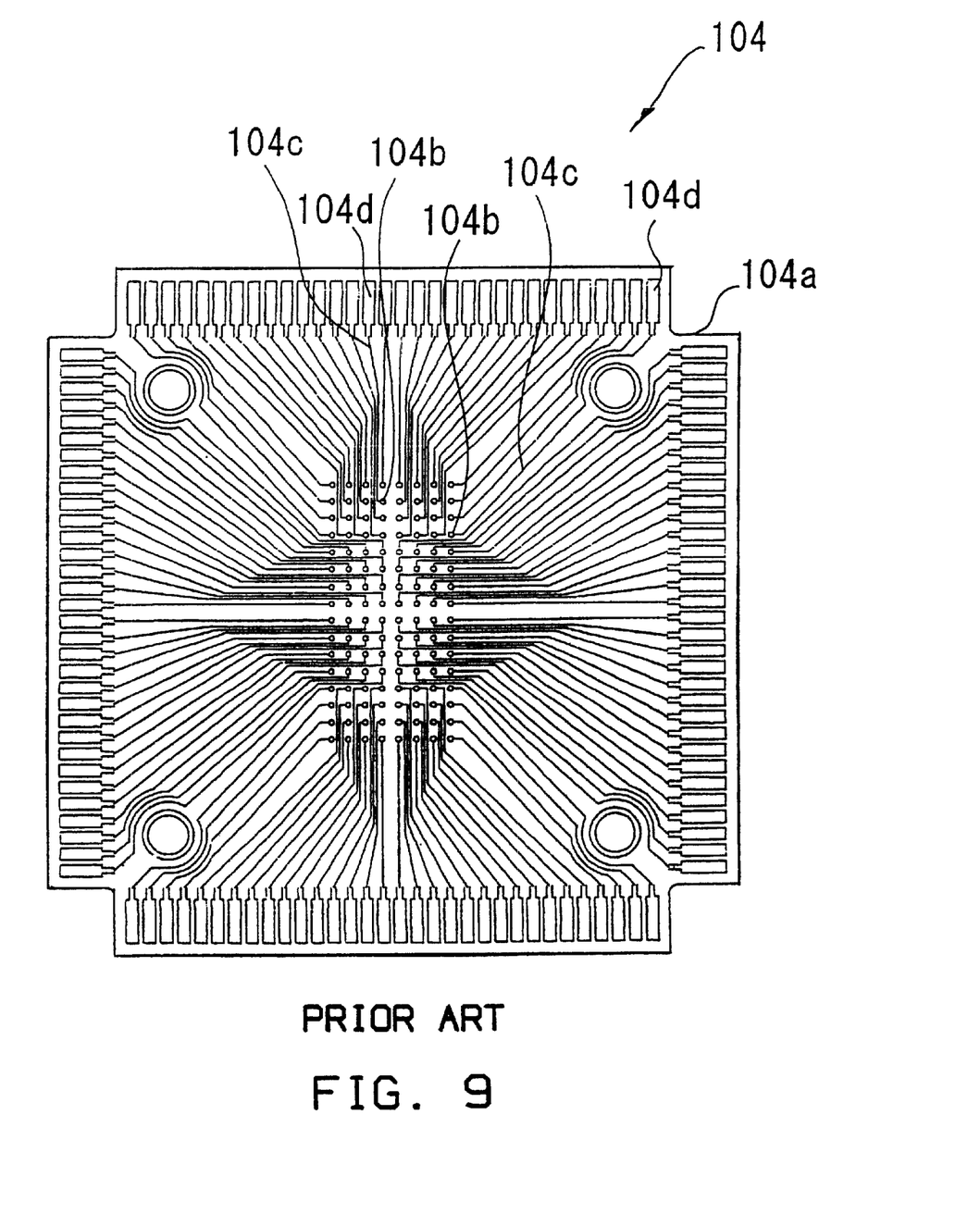
FIG. 9 is a top plan view of an interface contact film used in the FIG. 8 prior art socket.

With reference to FIG. 9, a generally square shaped contact film 104 has a plurality of inner conductive pads 104b arranged at the center of the film in conformity with the pattern of solder balls 108a of BGA package 108. Inner pads 104b are respectively connected to outer conductive pads 104d arranged along the outer peripheral part of film 104a through a selected wiring pattern 104c.

Again, with reference to FIG. 8, an adapter 109, capable of seating BGA package 108 with solder balls 108a exposed in an opening in the adapter, is removably provided on support 105 of base 102. Adapter 109 is placed over contact film 104 with the inner pads 104b of contact film 104 disposed at the opening of the adapter and with the outer peripheral part of the contact film bent by rib 109a of the adapter into a recess 102a formed in the base. The outer peripheral part of the contact film is received between rib 109a and contacts 111 mounted in the recess with the outer pads 104d electrically connected to respective contacts 111. Thus, an electrical connection is made from solder balls 108a to inner pads 104b which are connected by wiring pattern 104c to outer pads 104d and then to contacts 111 which in turn are connected to external substrate 110.

Cover member 103 has a compression member 112 for engaging adapter 109 as well as a BGA package 108 received in adapter 109. Compression member 112 is biased in a direction away from cover member 103 by means of a compression coil spring 113.

A BGA package 108 is arranged on contact film 104 through the opening in adapter 109 and cover member 103 is then closed, thereby causing the solder balls 108a of the BGA package and respective inner pads 104b of the contact film 104 to be connected with a compressive force applied from both base 102 through support 105 and cover member 103 through engagement portion 112. In the prior art socket described above, rubber sheet 106 which is interposed between support 105 and contact film 104 is plastically deformed when it is heated in a compressed state in connection with burn-in tests, thereby adversely affecting the effectiveness of the desired function of elastically receiving BGA package 108 and contact film 104 between support 105 and engagement member 112. As a result, it has been difficult to produce a suitable pressure between solder balls 108a of BGA package 108 and respective inner pads 104b of contact film 104 by merely employing the compression coil springs 107 and 113 through support 105 and engagement member 112. Further, with respect to contact film 104 used in the prior art socket, it has been necessary to arrange the same number of inner pads 104b and outer pads 104d as the solder balls 108a of the BGA package as well as the number of interconnecting paths between respective inner and outer pads. As the number of the solder balls of BGA package 108 increase, the inner pads 104b of the contact film are made smaller, thereby making it more difficult to form a wiring pattern 104c on contact film 104. Although it may be possible to form the contact film as a multi-layer substrate in order to facilitate forming the interconnections, such a substrate reduces flexibility, thereby making it unsuitable for use in this kind of socket.

SUMMARY OF THE INVENTION

It is an object of the present invention to provide a socket free of the above described prior art limitations. Another object of the invention is the provision of a socket in which the electrical connection between the terminals of an electronic package and the contacts of an interface contact film are optimized. Yet another object is the provision of a socket having an interface contact film particularly adapted for electronic packages having a large number of terminals.

A socket made in accordance with a preferred embodiment of the invention comprises a base wherein electrically conductive contact members capable of contacting each terminal of an electronic package having terminals arranged according to a selected pattern and a plurality of electrically conductive spring contact elements capable of applying force to the contact members from below are mounted and aligned respectively with each terminal of the electronic package. A compression member capable of moving in a direction either toward or away from the base is provided for applying a force from above tending to compress the spring contact elements.

According to a feature of the invention, the contact members are mounted on an interface contact film which is received on a surface of a support member which is also formed with a plurality of bores therethrough in alignment with the contact members of the contact film. The electrically conductive spring contact elements are in the form of a coil spring received in each bore and adapted to apply a force to each contact member of the contact film from below.

According to another feature of the invention, an adapter is provided capable of accommodating an electronic package and exposing the package terminals and each of the contact members. The terminals of the electronic package are connectable with the contact members of the interface contact film which is arranged between the adapter and the base, and a cover is provided that has a compression member capable of applying a force to the electronic package against the spring contact elements. The cover is mounted on the base and is pivotable between opened and closed positions in linkage with the compression member.

According to another feature of the invention, an inter-terminal pitch expansion substrate can be installed in the socket. The substrate has a plurality of terminals spaced apart a distance greater than the distance between the terminals of the electronic package inter-connected to the spring contact elements through a selected wiring pattern on the substrate.

According to yet another feature of the invention, the spring contact elements comprise a first axial length coil portion having a selected outer diameter and a second axial length coil portion having an outer diameter which is greater than the outer diameter of the first coil portion. The plurality of bores formed through the support member for receiving the spring contact elements have a first bore portion formed larger than the outer diameter of the first axial length portion and a second bore portion having a diameter formed somewhat smaller than the outer diameter of the second coil portion allowing fixation of the second coil portion in a respective bore of the support member while allowing free movement of the first coil portion and making it easier to install the spring contact elements.

According to a feature of the invention, the contact members of the interface contact film have a terminal engagement part formed in such a manner as to be engaged with a package terminal in conformity with the configuration of the terminals of the electronic package and, at the same time, have a contact engagement part for contacting a flattened end of a respective spring contact element.

BRIEF DESCRIPTION OF THE DRAWING

The accompanying drawings, incorporated in and constituting a part of the specification illustrate preferred embodiments of the invention and, together with the description, serve to explain the objects, advantages and principles of the invention. In the drawings.

DETAILED DESCRIPTION OF PREFERRED EMBODIMENTS

Figure 1:
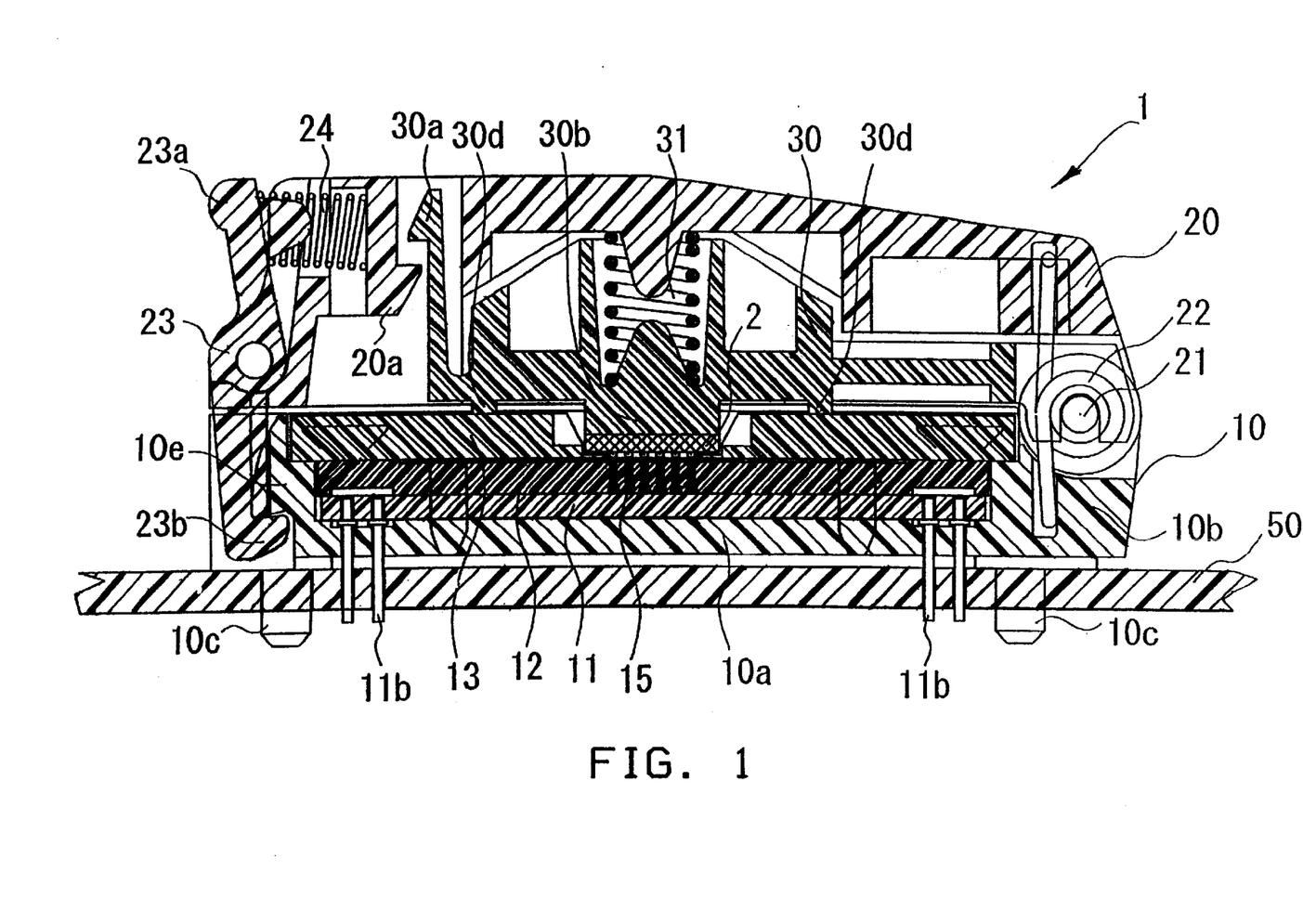
FIG. 1 is a side elevational cross section of a socket made according to a first embodiment of the invention shown with the cover thereof in the closed position.
Figure 2:
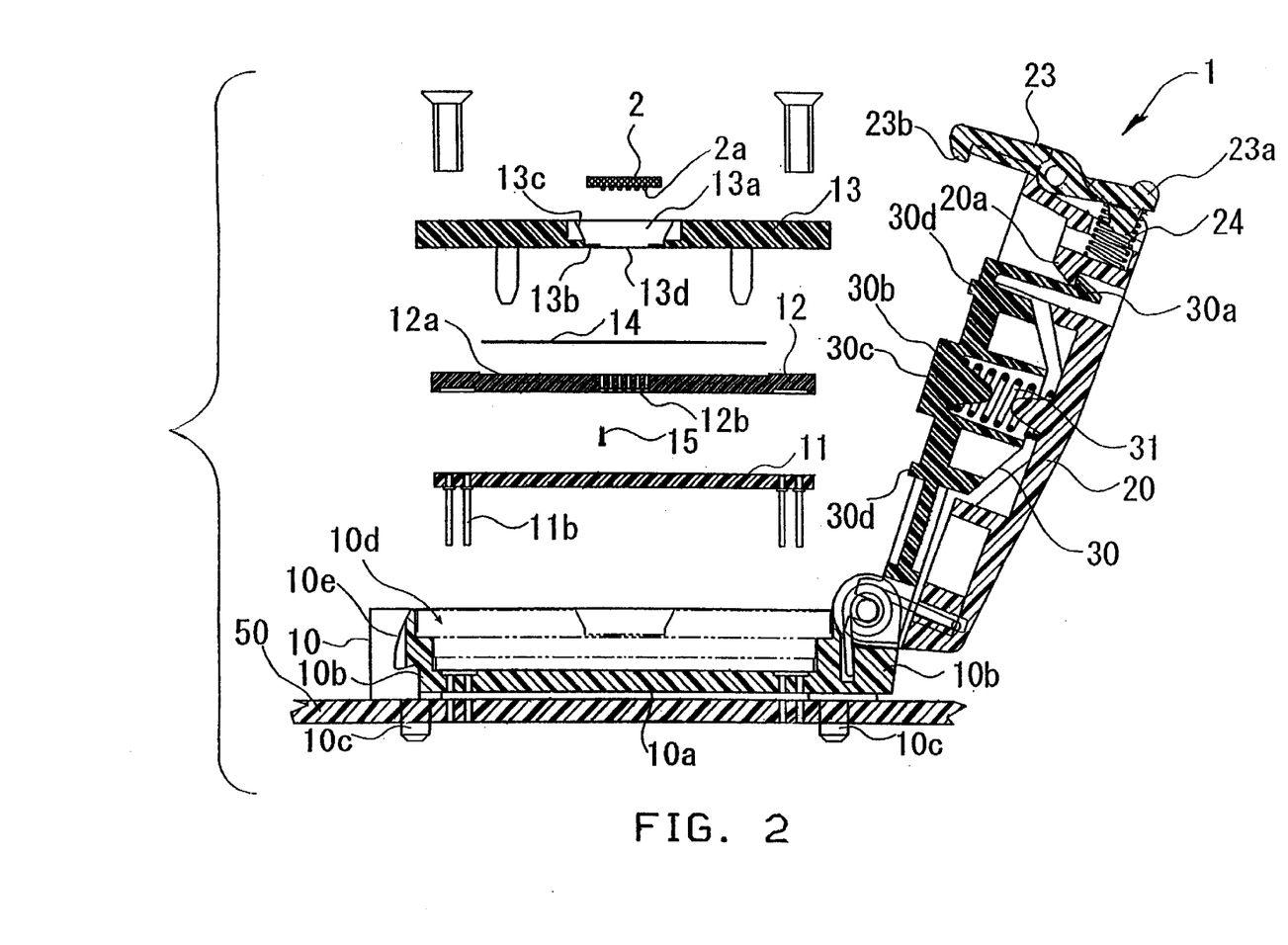
FIG. 2 is a side elevational cross section of the FIG. 1 socket shown with the cover in the opened position and shown with an exploded view of the components of the socket.

As shown in FIGS. 1 and 2, a socket 1 made in accordance with a first preferred embodiment of the invention is adapted for mounting an electronic package having a BGA terminal array (hereafter called package or electronic package) 2 with globular solder balls (terminals) 2a being formed in a selected pattern. The socket has a base (main socket body) 10 and a cover 20 pivotably mounted thereon and being movable between opened and closed positions relative to base 10. Base 10 is formed in the shape of a box by using suitable resinous material such as a polyether imide, and has a wall 10b that surrounds a generally squared shaped bottom 10a. Location pins 10c for mounting the socket on an external substrate 50 are provided extending from the lower surface of bottom 10a.

A recessed portion 10d of a prescribed size is formed in base 10 for receiving a pitch expansion substrate (inter-terminal expansion substrate) 11, a support member 12, and an adapter 13 in this order. These components are assembled, maintaining them parallel with bottom 10b of the base. A recessed contact film receiving surface 12a is formed at the top of the support member for placing thereon a sheet of interface contact film 14, to be described below. Surface 12a is formed to be lower than the top surface of support member 12 by a depth somewhat greater than the thickness of the interface contact film 14.

Figures 6A, 6B, 6C:
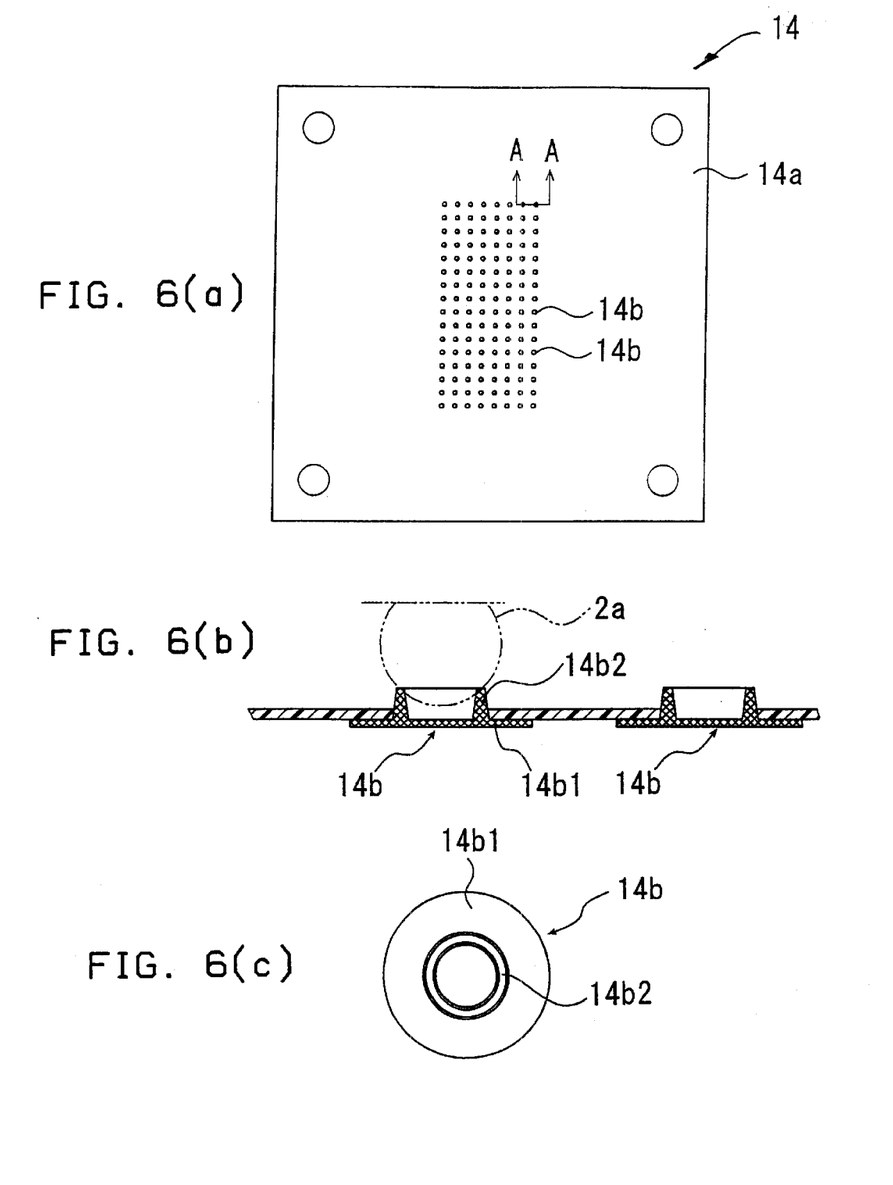
FIG. 6(a) is a top plan view of an interface contact film used in the FIGS. 1, 2 embodiment.
FIG. 6(b) is a cross section taken on line A—A of FIG. 6(a) showing contact members.
FIG. 6(c) is a top plan view showing one of the contact members of FIG. 6(b)

As shown in FIG. 6(a), interface contact film 14, formed of a generally square sheet 14a of suitable material, such as polyimide, has a plurality of contacts (contact members) 14b arranged in accordance with the selected pattern of solder balls 2a of package 2 at the central part of the film 14a. Each contact member 14b comprises a disc-shaped flat plate portion (contact part) 14b1 and a ball engagement part (terminal engagement part) 14b2 that is cylindrically formed having a diameter somewhat less than the diameter of the solder balls so as to be engageable with a part of the surface of the solder ball 2a as shown in FIG. 6(b). Contact member 14b preferably is provided with a plated layer of nickel, gold or the like. Each contact member 14b is placed at a selected location on contact film 14a, with plate part 14b1 on lower surface of contact film 14a, while the ball engagement part 14b2 extends through an aperture in the contact film to a location above the top surface thereof.

Figure 3A:
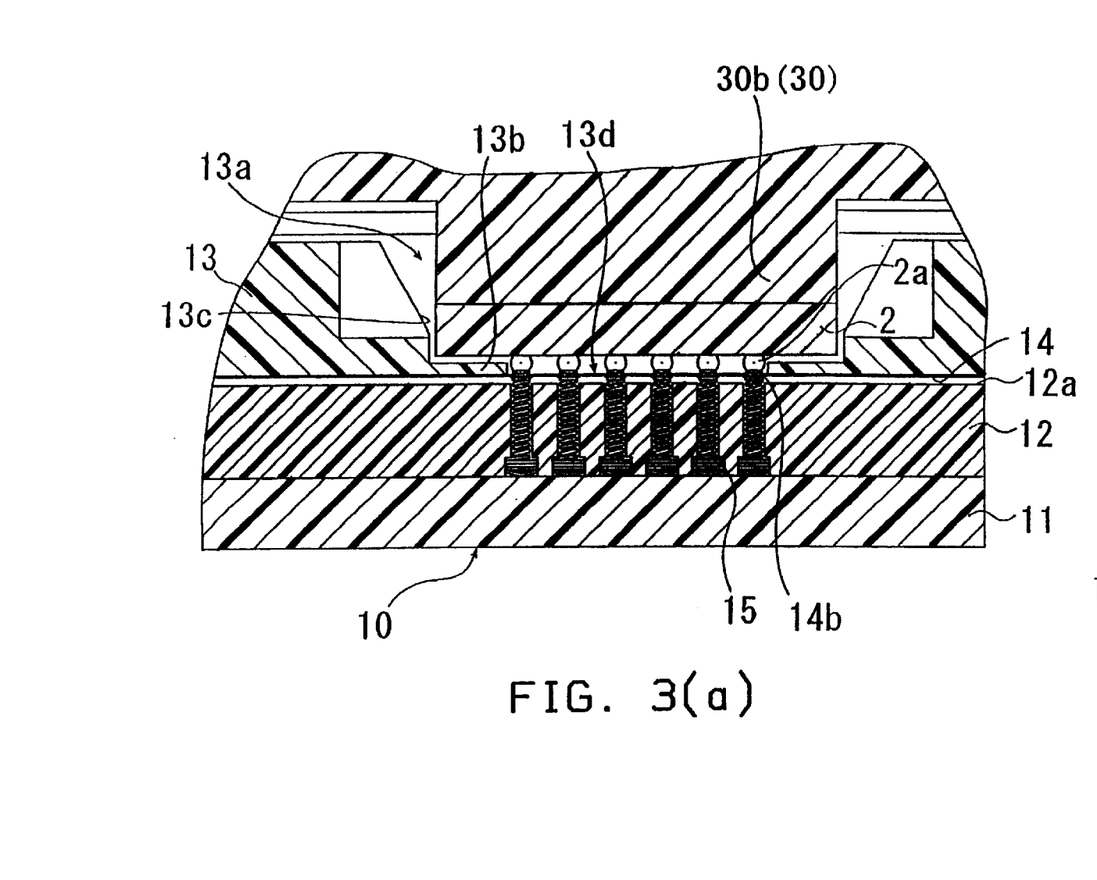
FIG. 3(a) is an enlarged, broken away portion of FIG. 1.
Figure 3B:
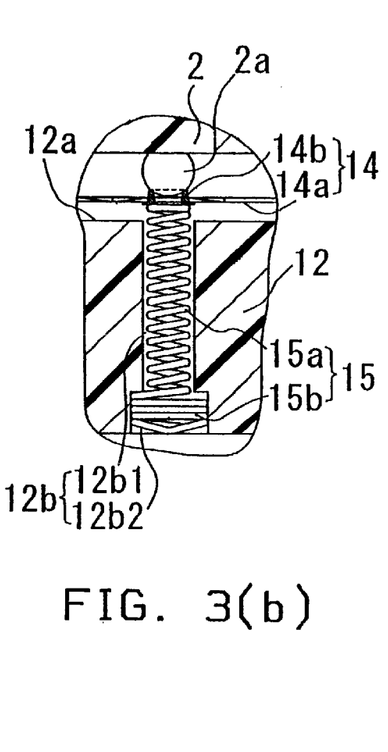
FIG. 3(b) is a further enlarged portion of FIG. 3(a)

As shown in FIGS. 1, 3(a) and 6(b), a plurality of spring contact elements 15, capable of contacting the plate part 14b1 of each contact 14b of the contact film are provided at the central portion of contact film receiving surface 12a of support member 12. Spring contact elements 15 are compression coil springs made of wiring material whose electrical conductivity is high, such as beryllium copper. With reference to FIG. 3(b), the contact spring elements comprise first spring portion 15a of a selected outer diameter and a second spring portion 15b having an outer diameter which is larger than the selected diameter, forming a step-like shape. The free end of the first spring portion 15a is preferably ground to form a flat surface. Each spring contact element 15 is formed so that its length is such that it extends beyond contact film receiving surface 12a a distance somewhat greater than the height of the recess in the top surface of support member 12 and, at the same time, the diameter of first spring part 15a is selected to be smaller than the diameter of plate part 14b1 of contact film 14a.

A plurality of spring receiving bores 12b, capable of receiving a respective spring contact element 15, are formed through support member 12. Bores 12b have a longitudinal axis normal to the top surface of support member 12 and are stepped having a first diameter portion 12b1 larger than the outer diameter of the first spring portion 15a and a second diameter portion 12b2 somewhat smaller than the outer diameter of the second spring portion 15b. A respective spring contact element 15 is inserted in diameter portion 12b2 with second portion 15b fixed therein with the lower end of second portion 15b protruding somewhat from the lower surface of support member 12 and with the top of the first portion 15a extending above the contact film receiving surface 12a of support member 12 by a selected amount.

Figure 4:
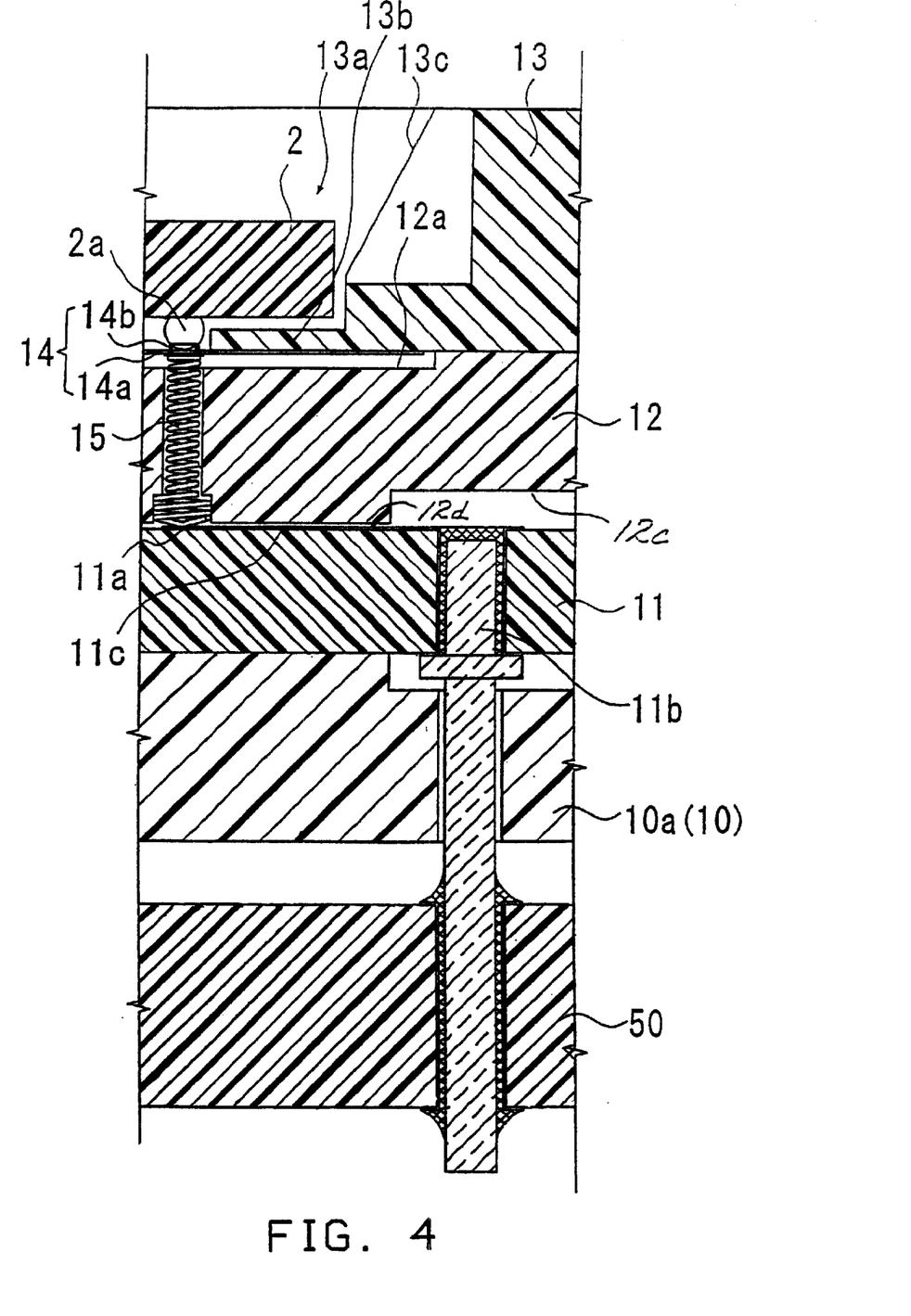
FIG. 4 is another enlarged fragmentary portion of FIG. 1.
Figure 5A:
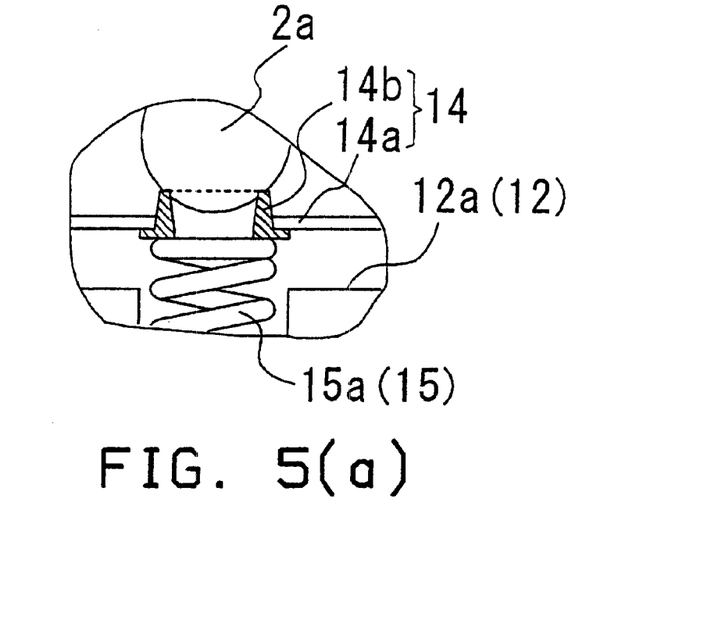
FIGS. 5(a) and 5(b) are further enlarged portions of FIG. 4.
Figure 5B:
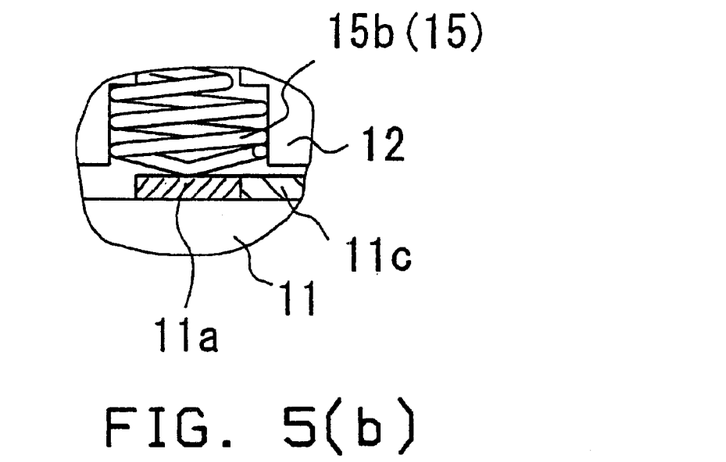

As shown in FIGS. 1 and 4, pitch expansion member 11, disposed in base 10, is arranged between support member 12 and bottom 10a of the base. With reference to FIG. 4, a recess 12c is formed in the bottom surface of support member 12 aligned with connective pins 11b, to be described. Further, a space 12d is preferably formed between the central portions of support member 12 and pitch expansion member 11. With reference to FIGS. 4 and 5(b), a plurality of pads 11a, engageable with the lower part of each spring contact element 15, are formed on the central portion of the upper surface of pitch expansion member 11. A plurality of connective pins 11b extend through bores along the edge part of pitch expansion substrate 11 and are capable of being connected with respective circuit paths of external substrate 50. Wiring pattern 11c is formed on the upper surface of pitch expansion substrate 11 for electrically connecting each pad 11a and the corresponding connective pin 11b. As a result, pitch expansion substrate 11 increases the spacing among the plurality of connective pins 11b relative to the spacing among the plurality of solder balls 2a.

As shown in FIGS. 1 and 3(a), adapter 13 is arranged over support member 12 with the lower surface of adapter 13 engaging the upper, outer peripheral surface around the edge of the support member, that is, excluding contact film receiving surface 12a. An electronic package seating portion 13a, capable of accommodating package 2, is centrally provided on adapter 13 and is formed somewhat larger than the outer shape of package 2. An inclined surface guide 13c is provided on the outer periphery of seating portion 13a for guiding package 2 to seat 13b at the bottom of seating portion 13a. Opening 13d, somewhat larger than the area occupied by solder balls 2a, is provided at seat 13b at the bottom of seating portion 13a.

As noted above, each spring contact 15 in support member 12 extends into opening 13d of adapter 13. As shown in FIGS. 1 and 2, cover 20 is pivotably supported on wall 10b on one side of base 10 by means of a shaft 21 and is movable between an opened position away from base 10 and a closed position on the base. A coil spring 22 is arranged on shaft 21 with opposite ends received in base 10 and cover 20 to apply a bias to the cover in an opening direction. A lever 23 is pivotably mounted at a location intermediate its ends at an opposite side of cover 20. One end 23a of the lever is biased away from the cover by a first compressive coil spring 24, so that an engagement part 23b formed at the other end can be engaged with a catch 10e on base 10.

A compression member 30 is pivotably mounted on shaft 21 and arranged within the cover. Compression member 30 is biased in a direction away from cover member 20 by a second compression coil spring 31 disposed between cover 20 and compression member 30. Movement of compression member 30 away from cover 20 is limited by an engagement part 30a formed at a side of compression member 30 opposite to the pivotable mounting side and is engageable with an engagement part 20a provided on cover 20. Because of this, compression member 30 pivots along with cover 20 when engagement parts 30a, 20a are engaged and moves independently of cover 20 when engagement parts 30a, 20a separate from each other.

A first boss-shaped engagement portion 30b is formed at a selected location of compression member 30 facing base 10 and is configured for receipt in the recess of seating portion 13a of the adapter. A generally flat surface 30c, approximately the same size as the outer shape of a package 2, is formed on the bottom of first engagement portion 30b for engagement with a package received on seat 13b. Second protruding engagement portions 30d are formed on the bottom of compression member 30 spaced apart from boss 30b, preferably on opposite sides of the boss relative to a direction extending away from the pivoted connection of compression member 30. When cover 20 is in the closed position, second engagement portions 30d engage adapter 13 and with surface 30c of first engagement portion 30b placed in parallel with bottom 10a of base 10 or support member 12.

The socket is prepared for use by mounting the socket on external substrate 50 using location pins 10c as shown in FIGS. 1 and 2. Cover 20 is placed in the opened position; the pitch expansion substrate 11 is inserted into recess 10d of base 10 and connective pins 11b are connected to external substrate 50. Next, a spring contact element 15 is inserted into each spring receiving bore 12b of support member 12 and the support member is arranged on the pitch expansion substrate 11. As noted above, the lower face of the support member is spaced from the wiring pattern 11c on pitch expansion substrate 11 and only the lower part of the spring contact elements 15 contact pads 11a of the pitch expansion substrate. The sheet of contact film 14 is placed on the contact film receiving surface 12a of support member 12 and the plate portion 14b1 of each contact member 14b is caused to engage the top of a respective spring contact element 15. Contact film 14 is supported at a position where the force that is received from each spring contact element 15 is balanced against the component of weight of the contact film and is placed in a state where it is positioned above receiving surface 12a. Thus, the contact film 14 tends to equalize the position of the tops of the spring contact elements 15 and forms a surface for receiving thereon solder balls 2a of package 2.

When adapter 13 is placed on support member 12, the recess in which surface 12a is formed is essentially closed by the lower surface of the adapter with contact film 14 being accommodated in the recess, while each ball engagement part 14b2 of contact film 14 is exposed to opening 13d of adapter 13. When a package 2 is dropped into seating portion 13a of adapter 13 and guided by guide portion 13c, the lower part of each solder ball 2a of package 2 is inserted into a respective ball engagement portion 14b2 of contact film 14. Package 2 is placed in a state of equilibrium at a location which is somewhat lowered from the holding position of the contact film alone due to the weight of the package 2 itself but is maintained spaced above seat 13b of seating portion 13a as each solder ball 2a is biased upwardly by a respective spring contact element 15.

As shown in FIG. 1, when cover 20 is moved to the closed position, compression member 30 moves along with cover 20 in engagement with the latter. As the cover closes, first engagement portion 30b of the compression member enters through the recess of the seating portion 13a of the adapter and surface 30c of first engagement portion 30b engages package 2 with an orientation which is somewhat tilted compared with the upper surface of package 2, and starts compressing the package from this position. Thus, package 2 will be inclined somewhat in conformity with the inclination of surface 30c. As the spring contact elements 15 absorb the tilting of package 2 by expanding or contracting, each solder ball 2a maintains a state of engagement with the ball engagement portion 14b2 of contact film 14. Thereafter, second engagement portion 30d engages the upper surface of adapter 13 and stops, while cover 20 moves on without being affected by the arrested motion of compression member 30. As the opening and closing lever 23 is being engaged with catch 10e of base 10, the cover stops on base 10 with compression member 30 pressed against adapter 13 by second compression coil spring 31. At this stage, package 2 will be oriented in parallel with support member 12 with the package pressed down further from the original state of equilibrium.

As a result of what has been described above, each solder ball 2a of package 2 is independently compressed as it receives the compressive force of a respective spring contact element 15 through ball engagement portion 14b2 of contact film 14 despite any deviation from parallelism between the upper surface of package 2 and an imaginary plane formed by the bottom of solder balls 2a or the variations in the distance between the upper surface of package 2 and the solder balls 2a in the perpendicular direction.

Film 14a of contact film 14 is free to flex in conformity with upward or downward movement of the tip of each spring contact element 15 in the space between the receiving surface 12a of support member 12 and adapter 13. Thus, contact members 14b of contact film 14 are not subject to any unnecessary tension from film 14a, with a result that the distance from other contact members 14b can be maintained approximately constant. Accordingly, a respective contact member does not move from the position of engagement with a solder ball 2a at ball engagement portion 14b2 or the position of the contact member with the top of the spring contact element 15 at the plate portion 14b1.

According to an aspect of the embodiment as described above, the solder balls of package 2 are received by spring contact elements 15 made of metal. Therefore, even if heated in a burn-in test, the contact elements 15 themselves will not be plastically deformed, thereby stabilizing the force with which the solder balls 2a of package 2 are received. Moreover, solder balls 2a of package 2 are received by spring contact elements 15 independently through ball engagement portions 14b2 of the contact film, thereby making it possible to absorb any variations in the position of the solder balls relative to package 2 by spring contact elements 15. Therefore, it becomes possible to more reliably provide a suitable pressure between the solder balls of package 2 and the ball engagement portions 14b2 of contact film 14, thereby bringing about a stabilized state of connection.

In the present embodiment, solder balls 2a of package 2 do not directly engage spring contact elements 15 since contact member 14b of the contact film has been interposed between the two. As a result, a contact interface is provided where each solder ball 2a of package 2 can be arranged at the top of a respective spring contact element 15 and a stable connection of solder balls 2a of package 2 to the top of a respective contact element 15 is provided irrespective of the variations in the height of the spring of the spring contact element 15.

In the present embodiment, moreover, contact members 14b of contact film 14 are held between each solder ball 2a and a respective spring contact element 15 without contacting other parts. Accordingly, it becomes possible to cause the contact members 14b to be engaged with solder balls 2a by receiving only the compressive force from spring contact elements 15, without receiving any restraining force from film 14a, thereby making it possible to maintain them without shifting the position of engagement between ball engagement portions 14b2 and solder balls 2 or the contact position between plate portions 14b1 and the top of contact elements 15.

According to this embodiment, further, pads 11a are adapted to be connected to respective spring contact elements 15, facilitating the use of pitch expansion substrate 11 on base 10, thereby making it unnecessary to form a wiring pattern on the contact film in the manner of the prior art. Therefore, it becomes only necessary to arrange contact members 14b in accordance with the pattern of solder balls 2a even when there are a large number of solder balls of package 2. Moreover, the flexibility of film 14a itself does not have to be compromised. Because of this, it becomes possible to use contact film 14 with a package 2 that has a large number of solder balls 2a. Further, since a wiring pattern on contact film 14 is unnecessary, the size of contact film 14 itself can be reduced and the expense required for the wiring pattern can be eliminated.

According to this embodiment, the shape of contact member 14b of contact film 14 has been so adapted that the shape of the ball engagement part 14b2 is made cylindrical in conformity with solder ball 2a of package 2 and, at the same time, plate portion 14b1 is made flat in conformity with the top of the spring contact 15. Accordingly, it becomes possible to insert the bottom portion of a solder ball 2a into the ball engagement portion 14b2 with spring contact 15 being received approximately evenly at the plate portion 14b1, thereby enhancing the state of connection between each solder ball 2a and the respective spring contact element 15.

According to this embodiment, moreover, a part of the spring contact element 15 is fixed to support member 12 merely by inserting the spring element into a bore in the member. Therefore, it becomes easier to install the spring contact elements 15.

Figure 7A:
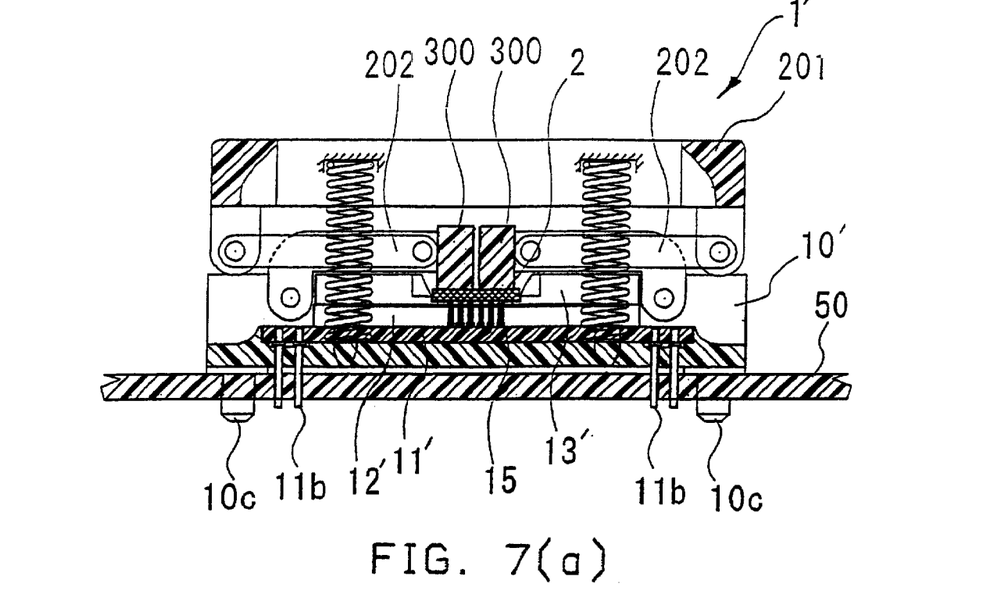
FIGS. 7(a) and 7(b) show side elevational cross sections of another embodiment of the invention shown with a cover in the raised and the lowered positions, respectively.
Figure 7B:
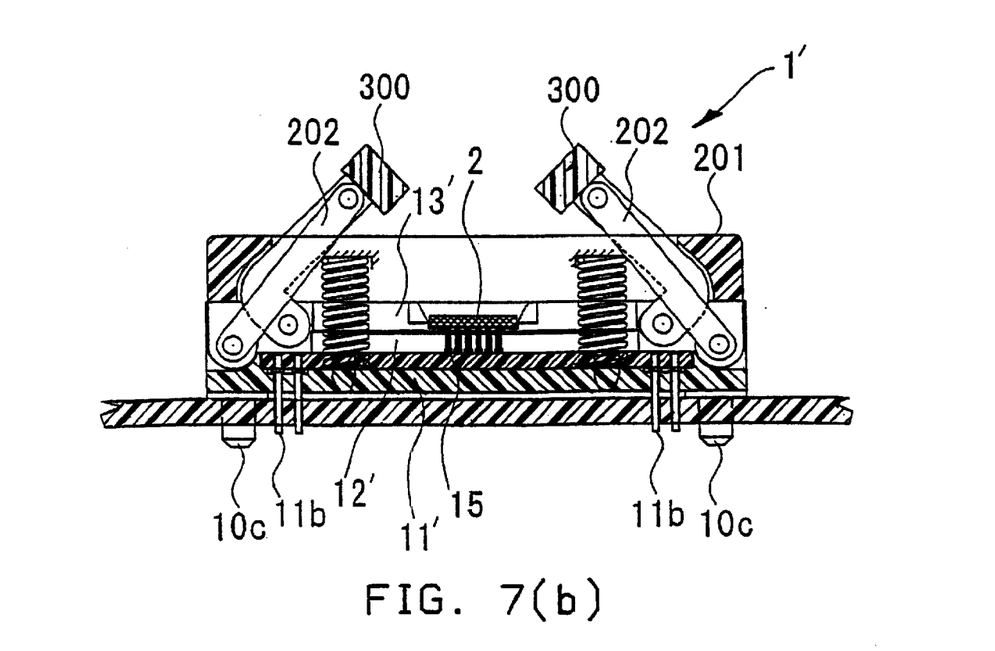

It should be noted that this invention does not have to be limited to the above described embodiment but that it can be modified in various ways. For example, FIGS. 7(a) and 7(b) show a socket 1' having a different force application mechanism. As shown in the figures, cover 201 is vertically movable relative to base 10' and compression member 300 is linked to cover 201 by means of a link member 202 for applying a force to package 2 in dependence upon the vertical movement of cover 201. Base 10' pitch expansion substrate 11' and support member 12' serve the same functions as corresponding components in the first described embodiment and are merely modified to conform to the different force application mechanism.

In the above described embodiments, the ball engagement portions 14b2 of contact film 14 are cylindrical in shape in conformity with solder balls 2a of package 2. However, when used with LGA (Land Grid Array) packages where no solder balls are provided, it is also possible to form the ball engagement part conically with the apex of the conical portion engaging respective pads of the LGA.

Further, although compression coil springs are used as the spring contact element 15 in the above described embodiments, a part or the whole of the spring contact elements could be replaced with some other kind of spring such as a plate spring, or similar conductive elastic members.

In the above described embodiments, a pitch expansion substrate 11 is described. However, the pitch expansion substrate may be unnecessary when the socket is used with a package in which the number of solder balls 2a is not so great and the distances among the terminals of the external substrate 50 can be made to conform with the distances among the solder balls.

It is the intention that the appended claims be interpreted as broadly as possible in view of the prior art to include all such socket variations and modifications in which the terminals of the electronic parts are elastically received and the connection with the contact member of the contact film is stabilized as well as a socket useful with electronic parts having a large number of terminals.

What is claimed is:

1. A socket for removably receiving an electronic package having a plurality of terminals arranged according to a selected pattern, for connecting said electronic package to circuit paths on an external substrate comprising:

a base formed of electrically insulative material, the base having a bottom and an upstanding sidewall thereabout forming a centrally disposed recess, a support member received in the recess of the base, the support member formed of electrically insulative material and having a top surface formed with a recessed contact film receiving surface, a sheet of electrically insulative, flexible contact film having a plurality of spaced apart, electrically conductive contact members thereon arranged according to the selected pattern, the sheet received on the contact film receiving surface, a plurality of bores formed through the support member in the selective pattern, a terminal pitch expansion substrate mounted on the base between the base and the support member, the terminal pitch expansion substrate having a top surface formed with a plurality of contact pads thereon arranged according to the selected pattern and aligned with the bores in the support member, the expansion substrate having a plurality of circuit paths with each contact pad electrically connected to a respective circuit path, an electrically conductive spring contact element received in each bore in the support member, the spring contact elements having an upper end in engagement with a respective contact member and a lower end in engagement with a respective contact pad on said terminal pitch expansion substrate, an adapter received in the recess of the base above the support member, the adapter having a terminal receiving opening formed therethrough and having an electronic package seat circumscribing the opening, the electronic package seat being located so that the terminals of an electronic package received on the electronic package seat engage respective contact members, a plurality of socket terminals extending through the bottom of the base, a respective socket terminal being electrically connected to a respective circuit path on said terminal pitch expansion substrate path, and a compression member mounted on the base and movable toward and away from the electronic package seat for applying a force to an electronic package received on the seat with the force in turn being transferred through the contact members to the spring contact elements.

2. A socket according to claim 1 in which the contact film has opposed face surfaces and is provided with a plurality of holes extending between the face surfaces and the contact members each have a generally flat plate portion disposed on one face surface and another portion extending through a respective hole to a location spaced from the other face surface.

3. A socket according to claim 1 further comprising a cover pivotably mounted on the base and movable between an opened position away from the base and a closed position on the base.

4. A socket according to claim 1 in which the terminal pitch expansion substrate has an outer marginal portion and is formed with a plurality of bores arranged along the e marginal portion with a respective socket terminal pin received in each bore of the terminal pitch expansion substrate.

5. A socket according to claim 1 further comprising a cover movable toward and away from the base in a vertical direction to the base and the compression member is linked to the cover for movement in dependence upon movement of the cover.

6. A socket according to claim 2 in which the socket is adapted for used with electronic packages having BGA terminals configured generally as solder balls having a ball diameter and the portion of the contact members extending through the holes of the contact film are shaped generally as cylindrical tubes having an inside diameter less than the ball diameter.

7. A socket according to claim 2 in which the spring contact elements comprise compression coil springs.

8. A socket according to claim 7 in which the compression coil springs have opposed first and second end portions and a longitudinal axis and the first end portion is formed with a generally flat surface generally normal to the longitudinal axis.

9. A socket according to claim 7 in which the compression coil springs are formed with a first axial length portion having a selected outer diameter and a second axial length portion having an outer diameter greater than the selected outer diameter and the plurality of bores formed in the support member have a first axial length portion having a diameter greater than the selected outer diameter of the first axial length portion of the compression coil springs and the bores having a second axial length portion having a diameter slightly less than the outer diameter of second axial length portion of the compression coil springs.

10. A socket according to claim 3 in which the compression member is pivotably mounted on the base and is disposed intermediate to the cover and the base, the compression member having a boss portion engageable with an electronic package disposed on the electronic package seat when the cover is in the closed position and a spring is disposed between the cover and the compression member for biasing the compression member away from the cover.

* * * * *